United States Patent [19]

Shigemori

[11] Patent Number: 5,073,776

[45] Date of Patent: Dec. 17, 1991

[54] DATA MODULATING SYSTEM

[75] Inventor: Toshihiro Shigemori, Yokohama, Japan

[73] Assignee: Ricoh Company, Ltd., Tokyo, Japan

[21] Appl. No.: 557,621

[22] Filed: Jul. 24, 1990

[30] Foreign Application Priority Data

Jul. 31, 1989 [JP] Japan .................. 1-196922

[51] Int. Cl.$^5$ .................. H03M 7/00; H03M 7/20
[52] U.S. Cl. .................. 341/106; 341/102
[58] Field of Search .................. 341/106, 102, 50, 94

[56] References Cited

U.S. PATENT DOCUMENTS

| | | | |
|---|---|---|---|
| 3,860,908 | 1/1975 | Stratton, III | 341/106 X |
| 4,216,460 | 8/1980 | Baldwin et al. | 341/94 X |
| 4,387,364 | 6/1983 | Shirota | 341/106 X |
| 4,430,643 | 2/1984 | Sevilla | 341/106 X |
| 4,467,315 | 8/1984 | Maruta et al. | 341/106 X |
| 4,577,180 | 3/1986 | Fukuda | 341/106 X |
| 4,598,267 | 7/1986 | Fukuda | 341/106 X |
| 4,855,742 | 8/1989 | Verboom | 341/102 |
| 4,926,169 | 5/1990 | Tong et al. | 341/173 |
| 4,937,574 | 6/1990 | Wright | 341/106 |

Primary Examiner—J. R. Scott
Assistant Examiner—Sharon D. Logan
Attorney, Agent, or Firm—Cooper & Dunham

[57] ABSTRACT

In a data modulating system, 12 bits of input data correspond to 15 channel bits of an output code. The input data of 12 bits are converted to the output code of 15 channel bits such that 7 channel bits in the output code provide code "1". The output code of 15 channel bits is divided into a first group of 7 channel bits and a second group of 8 channel bits. The number of bits in the first group providing code "1" the number of bits in the second group providing code "1" are respectively at 3 and 4, 4 and 3, or 2 and 5.

9 Claims, 8 Drawing Sheets

Fig. 5

| INPUT DATA | OUTPUT CODE |
|---|---|
| 0 0 0 0 0 | 0 0 0 1 0 1 1 |
| 0 0 0 0 1 | 0 0 1 0 0 1 1 |
| 0 0 0 1 0 | 0 1 0 0 0 1 1 |
| 0 0 0 1 1 | 0 0 0 1 1 0 1 |
| 0 0 1 0 0 | 0 0 1 0 1 0 1 |
| 0 0 1 0 1 | 0 1 0 0 1 0 1 |
| 0 0 1 1 0 | 1 0 0 0 1 0 1 |
| 0 0 1 1 1 | 0 0 1 1 0 0 1 |
| 0 1 0 0 0 | 0 1 0 1 0 0 1 |
| 0 1 0 0 1 | 1 0 0 1 0 0 1 |
| 0 1 0 1 0 | 0 1 1 0 0 0 1 |
| 0 1 0 1 1 | 1 0 1 0 0 0 1 |
| 0 1 1 0 0 | 1 1 0 0 0 0 1 |
| 0 1 1 0 1 | 0 0 0 1 1 1 0 |
| 0 1 1 1 0 | 0 0 1 0 1 1 0 |
| 0 1 1 1 1 | 0 1 0 0 1 1 0 |
| 1 0 0 0 0 | 1 0 0 0 1 1 0 |
| 1 0 0 0 1 | 0 0 1 1 0 1 0 |
| 1 0 0 1 0 | 0 1 0 1 0 1 0 |
| 1 0 0 1 1 | 1 0 0 1 0 1 0 |
| 1 0 1 0 0 | 0 1 1 0 0 1 0 |
| → 1 0 1 0 1 | 1 0 1 0 0 1 0 |
| 1 0 1 1 0 | 1 1 0 0 0 1 0 |
| 1 0 1 1 1 | 0 0 1 1 1 0 0 |
| 1 1 0 0 0 | 0 1 0 1 1 0 0 |
| 1 1 0 0 1 | 1 0 0 1 1 0 0 |
| 1 1 0 1 0 | 0 1 1 0 1 0 0 |
| 1 1 0 1 1 | 1 0 1 0 1 0 0 |
| 1 1 1 0 0 | 1 1 0 0 1 0 0 |
| 1 1 1 0 1 | 0 1 1 1 0 0 0 |
| 1 1 1 1 0 | 1 0 1 1 0 0 0 |
| 1 1 1 1 1 | 1 1 0 1 0 0 0 |

Fig. 6

| INPUT DATA | OUTPUT CODE |
|---|---|
| 0 0 0 0 | 0 0 0 0 1 0 1 |
| 0 0 0 1 | 0 0 0 1 0 0 1 |
| 0 0 1 0 | 0 0 1 0 0 0 1 |
| 0 0 1 1 | 0 1 0 0 0 0 1 |
| 0 1 0 0 | 0 0 0 1 0 1 0 |
| → 0 1 0 1 | 0 0 1 0 0 1 0 |
| 0 1 1 0 | 0 1 0 0 0 1 0 |
| 0 1 1 1 | 1 0 0 0 0 1 0 |
| 1 0 0 0 | 0 0 0 1 1 0 0 |
| 1 0 0 1 | 0 0 1 0 1 0 0 |
| 1 0 1 0 | 0 1 0 0 1 0 0 |
| 1 0 1 1 | 1 0 0 0 1 0 0 |
| 1 1 0 0 | 0 0 1 1 0 0 0 |
| 1 1 0 1 | 0 1 0 1 0 0 0 |
| 1 1 1 0 | 1 0 0 1 0 0 0 |
| 1 1 1 1 | 1 0 1 0 0 0 0 |

Fig. 7

| INPUT DATA | OUTPUT CODE | INPUT DATA | OUTPUT CODE |
|---|---|---|---|
| 000000 | 00100111 | 100000 | 11100001 |
| 000001 | 01000111 | 100001 | 00101110 |
| 000010 | 10000111 | 100010 | 01001110 |
| 000011 | 00011011 | 100011 | 10001110 |
| 000100 | 00101011 | 100100 | 00110110 |
| 000101 | 01001011 | 100101 | 01010110 |
| 000110 | 10001011 | 100110 | 10010110 |
| 000111 | 00110011 | 100111 | 01100110 |
| 001000 | 01010011 | 101000 | 10100110 |
| 001001 | 10010011 | 101001 | 11000110 |
| 001010 | 01100011 | 101010 | 00111010 |
| 001011 | 10100011 | 101011 | 01011010 |
| 001100 | 11000011 | 101100 | 10011010 |
| 001101 | 00011101 | 101101 | 01101010 |
| 001110 | 00101101 | 101110 | 10101010 |
| 001111 | 01001101 | 101111 | 11001010 |
| 010000 | 10001101 | 110000 | 01110010 |
| 010001 | 00110101 | 110001 | 10110010 |
| 010010 | 01010101 | 110010 | 11010010 |
| 010011 | 10010101 | 110011 | 11100010 |
| 010100 | 01100101 | 110100 | 01011100 |
| →010101 | 10100101 | 110101 | 10011100 |
| 010110 | 11000101 | 110110 | 01101100 |
| 010111 | 00111001 | 110111 | 10101100 |
| 011000 | 01011001 | 111000 | 11001100 |
| 011001 | 10011001 | 111001 | 01110100 |
| 011010 | 01101001 | 111010 | 10110100 |
| 011011 | 10101001 | 111011 | 11010100 |
| 011100 | 11001001 | 111100 | 11100100 |
| 011101 | 01110001 | 111101 | 10111000 |
| 011110 | 10110001 | 111110 | 11011000 |
| 011111 | 11010001 | 111111 | 11101000 |

Fig. 8

| INPUT DATA | OUTPUT CODE | INPUT DATA | OUTPUT CODE |
|---|---|---|---|
| 0 0 0 0 0 0 | 0 0 0 1 0 1 0 1 | 0 1 1 0 0 0 | 0 1 0 1 0 1 0 0 |
| 0 0 0 0 0 1 | 0 0 1 0 0 1 0 1 | 0 1 1 0 0 1 | 1 0 0 1 0 1 0 0 |
| 0 0 0 0 1 0 | 0 1 0 0 0 1 0 1 | 0 1 1 0 1 0 | 0 1 1 0 0 1 0 |
| 0 0 0 0 1 1 | 0 0 0 1 1 0 0 1 | 0 1 1 0 1 1 | 1 0 1 0 0 1 0 0 |
| 0 0 0 1 0 0 | 0 0 1 0 1 0 0 1 | 0 1 1 1 0 0 | 0 1 0 1 1 0 0 0 |
| 0 0 0 1 0 1 | 0 1 0 0 1 0 0 1 | 0 1 1 1 0 1 | 1 0 0 1 1 0 0 0 |
| 0 0 0 1 1 0 | 0 0 1 1 0 0 0 1 | 0 1 1 1 1 0 | 0 1 1 0 1 0 0 0 |
| 0 0 0 1 1 1 | 0 1 0 1 0 0 0 1 | 0 1 1 1 1 1 | 1 0 1 0 1 0 0 0 |
| 0 0 1 0 0 0 | 0 0 0 1 0 1 1 0 | 1 0 0 0 0 0 | 0 0 0 1 0 0 1 1 |
| 0 0 1 0 0 1 | 0 0 1 0 0 1 1 0 | 1 0 0 0 0 1 | 0 0 1 0 0 0 1 1 |
| 0 0 1 0 1 0 | 0 1 0 0 0 1 1 0 | 1 0 0 0 1 0 | 0 1 0 0 0 0 1 1 |
| 0 0 1 0 1 1 | 0 0 0 1 1 0 1 0 | 1 0 0 0 1 1 | 1 0 0 0 0 0 1 1 |
| 0 0 1 1 0 0 | 0 0 1 0 1 0 1 0 | 1 0 0 1 0 0 | 0 0 0 0 1 1 0 1 |
| 0 0 1 1 0 1 | 0 1 0 0 1 0 1 0 | 1 0 0 1 0 1 | 1 0 0 0 0 1 0 1 |
| 0 0 1 1 1 0 | 1 0 0 0 1 0 1 0 | 1 0 0 1 1 0 | 1 0 0 0 1 0 0 1 |
| 0 0 1 1 1 1 | 0 0 1 1 0 0 1 0 | 1 0 0 1 1 1 | 1 0 0 1 0 0 0 1 |
| 0 1 0 0 0 0 | 0 1 0 1 0 0 1 0 | 1 0 1 0 0 0 | 0 1 1 0 0 0 0 1 |
| 0 1 0 0 0 1 | 1 0 0 1 0 0 1 0 | 1 0 1 0 0 1 | 1 0 1 0 0 0 0 1 |
| 0 1 0 0 1 0 | 0 1 1 0 0 0 1 0 | 1 0 1 0 1 0 | 1 1 0 0 0 0 0 1 |
| 0 1 0 0 1 1 | 1 0 1 0 0 0 1 0 | 1 0 1 0 1 1 | 1 0 0 0 0 1 1 0 |
| 0 1 0 1 0 0 | 0 0 1 0 1 1 0 0 | 1 0 1 1 0 0 | 1 1 0 0 0 0 1 0 |
| →0 1 0 1 0 1 | 0 1 0 0 1 1 0 0 | 1 0 1 1 0 1 | 1 1 0 0 0 1 0 0 |
| 0 1 0 1 1 0 | 1 0 0 0 1 1 0 0 | 1 0 1 1 1 0 | 1 1 0 0 1 0 0 0 |
| 0 1 0 1 1 1 | 0 0 1 1 0 1 0 0 | 1 0 1 1 1 1 | 1 0 1 1 0 0 0 0 |

1

DATA MODULATING SYSTEM

BACKGROUND OF THE INVENTION

1. Field of the Invention

The present invention relates to a data modulating system for recording information in an optical disk, etc.

2. Description of the Related Art

In general, a so-called 4/11 modulating system is often used when information is recorded to an optical disk, etc.

In this 4/11 modulating system, input data are are in an 8-bit code and are converted to an output code composed of 11 channel bits. In this conversion, 4 channel bits in the output code are set to a code "1" at any time with respect to the respective input data composed of 256 words. In general, when such a data modulating system in which the predetermined number of code "1" is assigned in the predetermined length of output code is used, a DC component in a reproduced signal is constant. Accordingly, it is easy to remove the change in DC voltage level of a transmission system by a method using AC coupling, etc. during a data reproducing process.

When the above mentioned data modulating system is used, it is possible to use a differential deflection system during a data reproducing process. A differential detection system determines the channel bit position having code "1" by comparing the reproduced signal level at every channel bit position and selecting the predetermined number of channel bit positions out of channel bits positions having a high level. Since a differential detection system reduces the influence of noise in the reproduced signal, the above modulating system is often used in an optical disk drive.

However, in the above-mentioned 4/11 modulating system, a large amount of memory capacity for a conversion table such as 256 words×11 bits is required so that it is difficult to reduce the cost of the data modulating system. Further, the amount of input data bits per one channel bit is equal to 8 bits/11 bits=0.7272--- and is therefore small so that conversion efficiency is low and it is impossible to increase recording capacity of the disk.

SUMMARY OF THE INVENTION

It is therefore an object of the present invention to provide a data modulating system for improving conversion efficiency and reducing memory capacity for a conversion table.

The above object of the present invention can be achieved by a data modulating system comprising means for converting the input data of 12 bits to the output code of 15 channel bits such that 7 channel bits in the output code provide a code "1".

In the above data modulating system, the output code of 15 channel bits is divided into a first group of 7 channel bits and a second group of 8 channel bits, and the number of bits in the first group providing the code "1" and the number of bits in the second group providing the code "1" are respectively set to 3 and 4, 4 and 3, or 2 and 5.

The above data modulating system further comprises a first conversion table in which 7 channel bits of the output code correspond to 5 bits of the input data and 3 bits in the 7 channel bits are converted to the code "1"; a second conversion table in which 7 channel bits of the output code correspond to 4 bits of the input data and 2 bits in the 7 channel bits are converted to the code "1"; a third conversion table in which 8 channel bits of the output code correspond to 6 bits of the input data and 4 bits in the 8 channel bits are converted to the code "1"; and a fourth conversion table in which 8 channel bits of the output code correspond to 6 bits of the input data and 3 bits in the 8 channel bits are converted to the code "1".

In accordance with the above-mentioned construction, it is possible to provide a data modulating system for improving conversion efficiency and reducing memory capacity for a conversion table.

Further objects and advantages of the present invention will be apparent from the following description of the preferred embodiments of the present invention as illustrated in the accompanying drawings.

BRIEF DESCRIPTION OF THE DRAWINGS

FIG. 5 is a view showing a concrete example of a first conversion table in the present invention;

FIG. 6 is a view showing a concrete example of a second conversion table in the present invention;

FIG. 7 is a view showing a concrete example of a third conversion table in the present invention; and FIG. 8 is a view showing a concrete example of a fourth conversion table in the present invention.

DESCRIPTION OF THE PREFERRED EMBODIMENTS

The preferred embodiments of a data modulating system in the present invention will next be described in detail with reference to the accompanying drawings.

Figure 1:
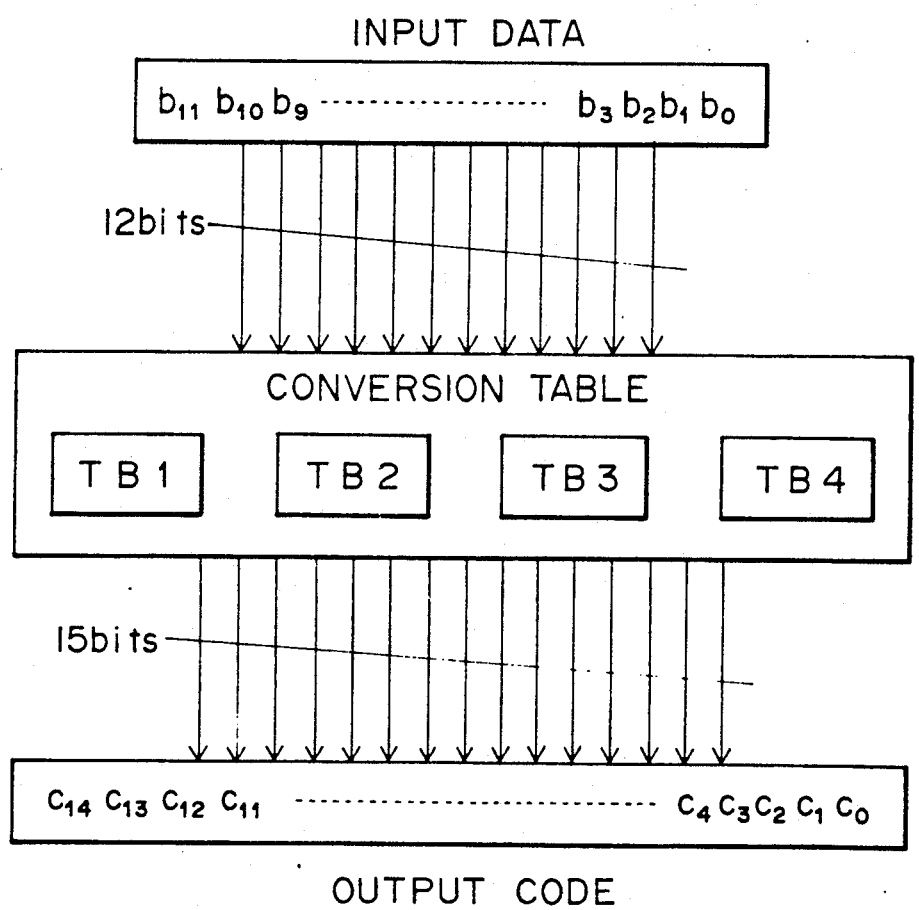
FIG. 1 is a view showing the principle of a data modulating system in one embodiment of the present invention.
Figure 2:
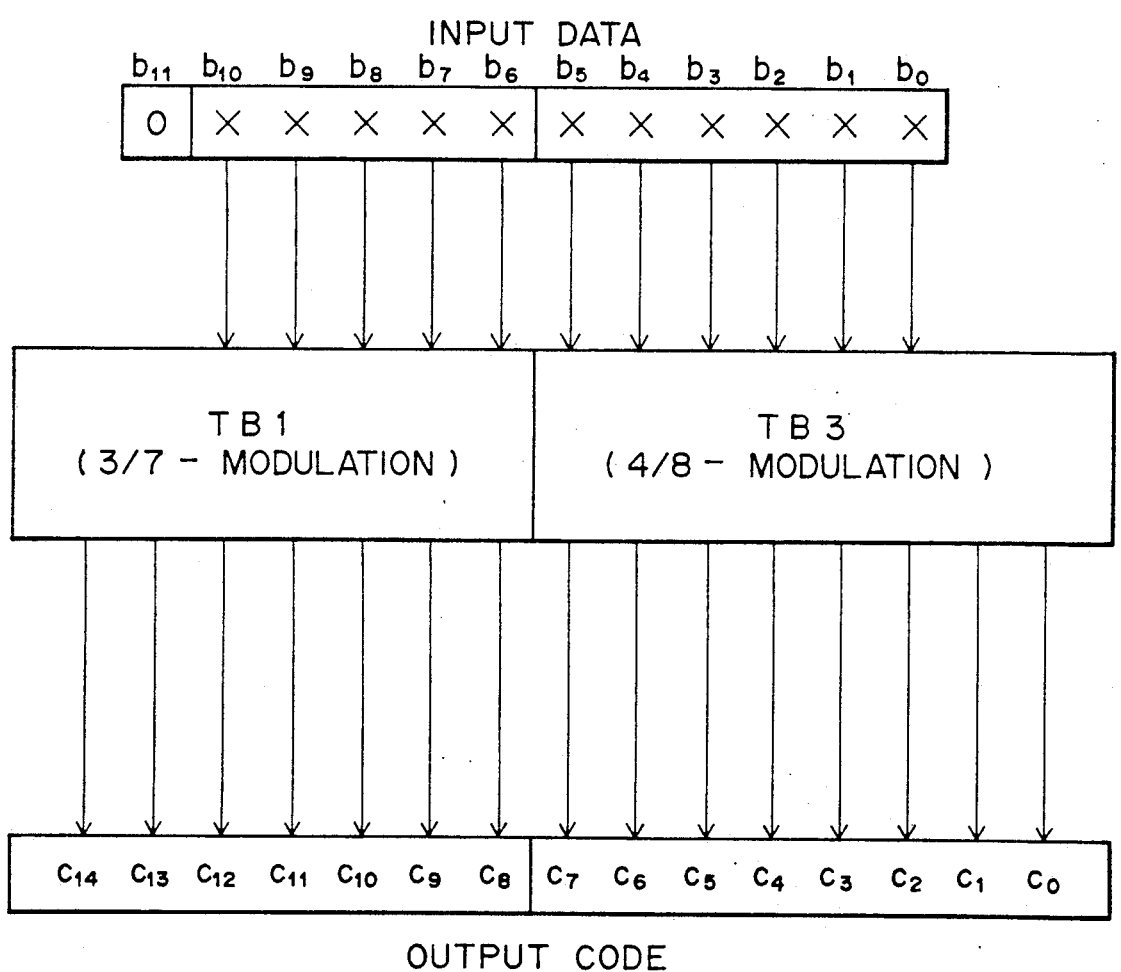
FIG. 2 is a view showing a first conversion processing pattern in 7/15 modulation in the present invention.
Figure 3:
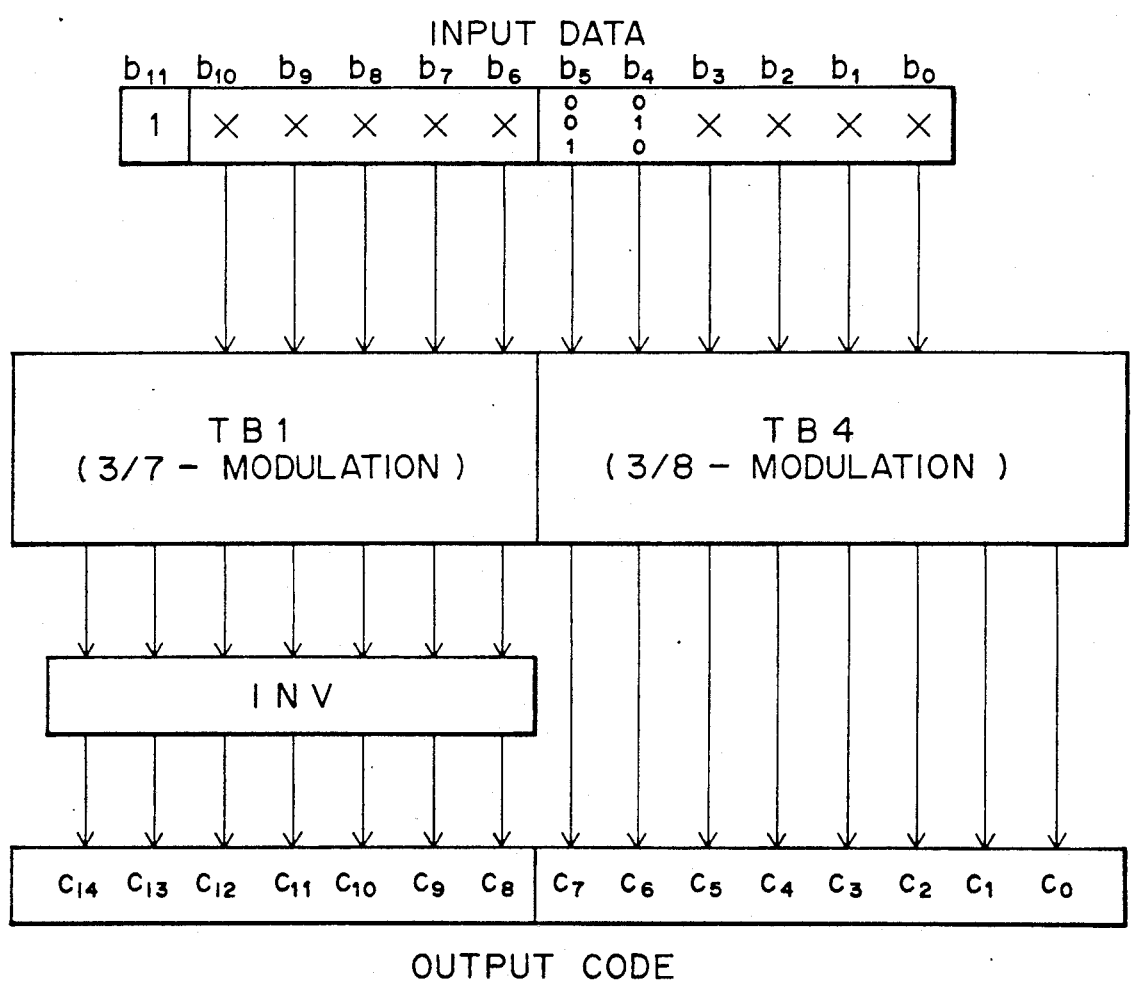
FIG. 3 is a view showing a second conversion processing pattern in the 7/15 modulation in the present invention.

FIG. 1 shows the principle of a data modulating system in one embodiment of the present invention. FIGS. 2 and 3 respectively show conversion processing patterns of data modulation in the present invention.

In the data modulating system in the present invention, input data composed of 12 bits ($b_{11}b_{10}$ - - - $b_2b_1b_0$) correspond to 15 channel bits ($c_{14}c_{13}$ - - - $c_2c_1c_0$) of an output code. 7 channel bits in the output code are set to a code "1" at any time. Such modulation is called 7/15 modulation in the following description.

The input data composed of 12 bits are provided by $2^{12}=4096$ combinations. In the case of the output code constructed by 15 channel bits, the number of combinations providing seven codes "1" is given by $_{15}C_7=6435$. Accordingly, the 4096 combinations equal to those in the input data are selected from these 6435 combinations, and the selected 4096 combinations in the output code respectively correspond to those in the input code.

In the data modulating system of the present invention, 12 bits of the input data correspond to 15 channel bits of the output code to perform the 7/15 modulation. Accordingly, it is possible to increase the amount of input data bits per one channel bit such as 12/15=0.8. The conversion efficiency in the present invention is increased at 10% to that of the 4/11 modulating method.

Further, to reduce the capacity for the conversion table in the above 7/15 modulation and to efficiently perform the above 7/15 modulation, the output code composed of 15 channel bits ($c_{14}c_{13}$ - - - $c_2c_1c_0$) is divided into a first group ($c_{14}$ - - - $c_8$) composed of 7 channel bits and a second group ($c_7$ - - - $c_0$) composed of 8 channel bits. The number of bits providing the code "1" in the first group and the number of bits providing the code "1" in the second group are respectively set to 3 and 4, 4 and 3, or 2 and 5 such that 7 bits provide the code "1" at any time with respect to the entire 15 channel bits.

Further, the data modulating system has a first conversion table TB1 in which the 7 channel bits of the output code correspond to 5 bits of the input data and 3 bits in the 7 channel bits are converted to the code "1". The data modulating system has a second conversion table TB2 in which the 7 channel bits of the output code correspond to 4 bits of the input data and 2 bits in the 7 channel bits are converted to the code "1". The data modulating system has a third conversion table TB3 in which the 8 channel bits of the output code correspond to 6 bits of the input data and 4 bits in the 8 channel bits are converted to the code "1". The data modulating system has a fourth conversion table TB4 in which the 8 channel bits of the output code correspond to 6 bits of the input data and 3 bits in the 8 channel bits are converted to the code "1".

The output code of 15 channel bits is provided from the following processing item (a), (b) or (c) by using the above four conversion tables.

(a) The 7 channel bits of the first group ($c_{14}$ - - - $c_8$) with respect to the output code are calculated from the first conversion table TB1, and the 8 channel bits of the second group ($c_7$ - - - $c_0$) are calculated from the third conversion table TB3 (see FIG. 2).

(b) The 7 channel bits of the first group ($c_{14}$ - - - $c_8$) with respect to the output code are calculated by inverting an output code of the first conversion table TB1 by an inverter INV, and the 8 channel bits of the second group ($c_7$ - - - $c_0$) are calculated from the fourth conversion table TB4 (see FIG. 3).

Figure 4:
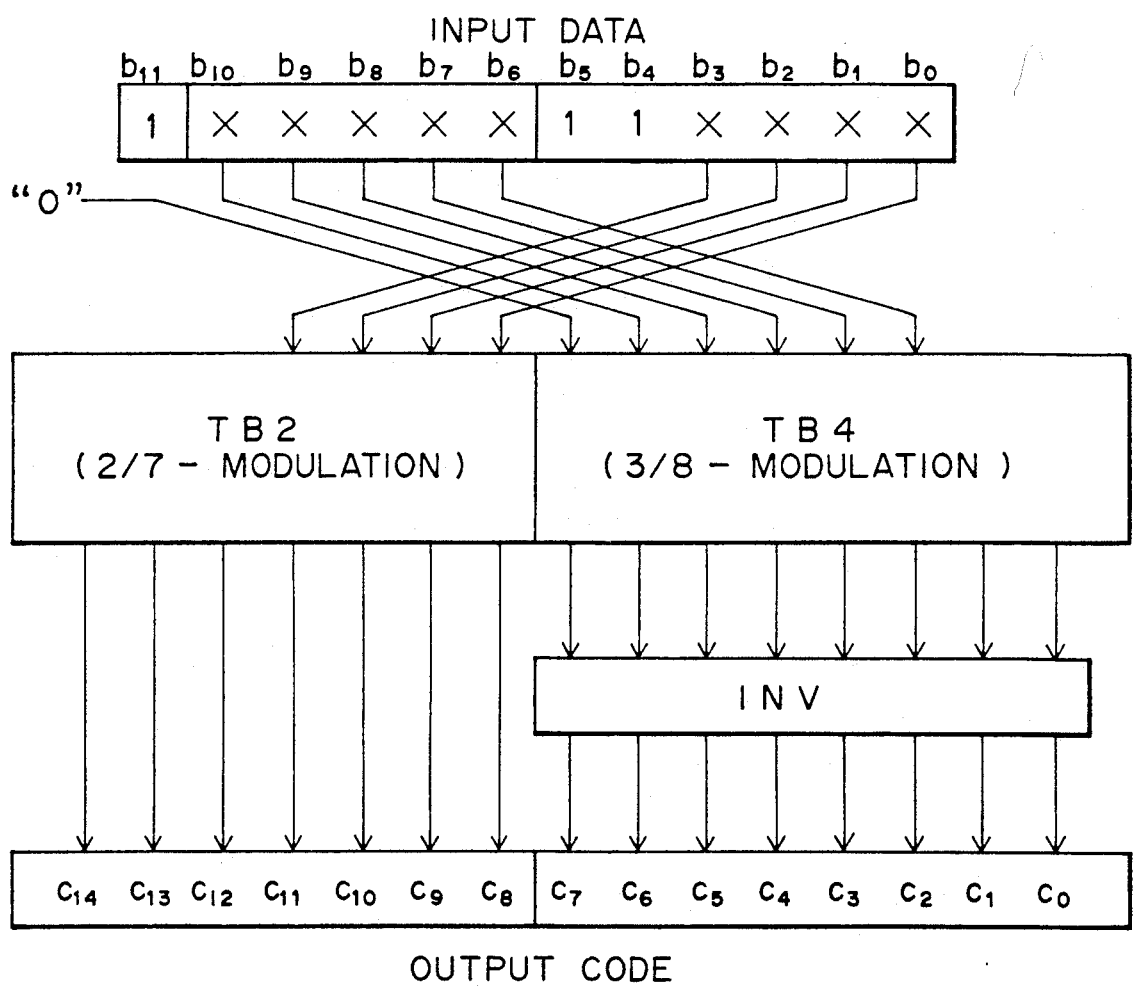
FIG. 4 is a view showing a third conversion processing pattern in the 7/15 modulation in the present invention.

(c) The 7 channel bits of the first group ($c_{14}$ - - - $c_8$) with respect to the output code are calculated from the second conversion table TB2, and the 8 channel bits of the second group ($c_7$ - - - $c_0$) are calculated by inverting an output code of the fourth conversion table TB4 by an inverter INV (see FIG. 4).

Further, to reduce the capacity for the conversion tables in the above 7/15 modulation, the input data composed of 12 bits ($b_{11}b_{10}$ - - - $b_2b_1b_0$) are divided into a first group of 5 bits ($b_{10}$ - - - $b_6$), a second group of 6 bits ($b_5$ - - - $b_0$) and the remaining 1 bit ($b_{11}$).

As shown in FIG. 2, the input data of the first group ($b_{10}$ - - - $b_6$) are inputted to the first conversion table TB1 and the input data of the second group ($b_5$ - - - $b_0$) are inputted to the third conversion table TB3 when the remaining 1 bit ($b_{11}$) is in a first predetermined bit state (e.g., "0") of two possible bit states "1" and "0".

As shown in FIG. 3, the input data of the first group ($b_{10}$ - - - $b_6$) are inputted to the first conversion table TB1 and the input data of the second group ($b_5$ - - - $b_0$) are inputted to the fourth conversion table TB4 when the remaining 1 bit ($b_{11}$) is in a second bit state (e.g., "1") and 2 bits ($b_5b_4$) predetermined and specified in the second group ($b_5$ - - - $b_0$) are in three predetermined bit states (e.g., "00", "01" and "10") of four possible bit states "00", "01", "10" and "11".

As shown in FIG. 4, the input data of the first group ($b_{10}$ - - - $b_6$) are inputted to the fourth conversion table TB4 and the input data of 4 bits ($b_3b_2b_1b_0$) except for the above two specified bits ($b_5b_4$) in the input data of the second group ($b_5$ - - - $b_0$) are inputted to the second conversion table TB2 when the remaining 1 bit ($b_{11}$) is in the second bit state (e.g., "1") and the bits ($b_5b_4$) specified in the second group ($b_5$ - - - $b_0$) are in the remaining one bit state (e.g., "11") except for the above three predetermined bit states.

As mentioned above, in accordance with the present invention, the input data composed of 12 bits ($b_{11}b_{10}$ - - - $b_2b_1b_0$) are divided into the first group of 5 bits ($b_{10}$ - - - $b_6$), the second group of 6 bits ($b_5$ - - - $b_0$) and the remaining 1 bit ($b_{11}$). The output code composed of 15 channel bits ($c_{14}c_{13}$ - - - $c_2c_1c_0$) is divided into the first group ($c_{14}$ - - - $c_8$) composed of 7 channel bits and the second group ($c_7$ - - - $c_0$) composed of 8 channel bits. The conversion tables are accessed every group of the input data to obtain the output code of the corresponding group. Accordingly, it is not necessary to prepare the memory capacity for the output code by one-to-one correspondence with respect to the respective input data having 4096 combinations as a total. Therefore, it is possible to reduce the memory capacity for the conversion tables. Further, the amount of input data bits per one channel bit is equal to 12 bits/15 bits=0.8 and is therefore increased so that the recording density of a disk can be increased.

Concrete embodiments of the present invention will next be described in detail.

FIG. 5 shows a concrete example of the first conversion table TB1 mentioned above. This first conversion table TB1 is a table for converting the input data composed of 5 bits to an output code composed of 7 channel bits in which 3 bits provide the code "1". The input data of 5 bits are provided by $2^5=32$ combinations. With respect to the output code constructed by 7 channel bits, the number of combinations with respect to 3 bits providing the code "1" is provided by $_7C_3=35$. Accordingly, the first conversion table is constructed by using output codes having 32 combinations from these 35 combinations.

FIG. 6 shows a concrete example of the second conversion table TB2 mentioned above. This second conversion table TB2 is a table for converting the input data composed of 4 bits to an output code composed of 7 channel bits in which 3 bits provide the code "1". The input data of 4 bits are provided by $2^4=16$ combinations. With respect to the output code constructed by 7 channel bits, the number of combinations with respect to 3 bits providing the code "1" is provided by $_7C_2=21$. Accordingly, the second conversion table is constructed by using output codes having 16 combinations from these 21 combinations.

FIG. 7 shows a concrete example of the third conversion table TB3 mentioned above. This third conversion table TB3 is a table for converting the input data composed of 6 bits to an output code composed of 8 channel bits in which 4 bits provide the code "1". The input data of 6 bits are provided by $2^6=64$ combinations. With respect to the output code constructed by 8 channel bits, the number of combinations with respect to 4 bits providing the code "1" is provided by $_8C_4=70$. Accordingly, the third conversion table is constructed by using output codes having 64 combinations from these 70 combinations.

FIG. 8 shows a concrete example of the fourth conversion table TB4 mentioned above. This fourth conversion table TB4 is a table for converting the input data composed of 6 bits to an output code composed of 8 channel bits in which 3 bits provide the code "1". In this fourth conversion table, two upper bits of the input data are set to "00", "01" and "10" without using "11". The input data of 6 bits are provided by $2^4 \times 3 = 48$ combinations since the operating states of the two upper bits are limited to the above three bit states. With respect to the output code constructed by 8 channel bits, the number of combinations with respect to 3 bits providing the code "1" is provided by $_8C_3 = 56$. Accordingly, the fourth conversion table is constructed by using output codes having 48 combinations from these 56 combinations.

Next, concrete processing examples of the data modulating system in the present invention will next be described by using the above four conversion tables TB1 to TB4.

EXAMPLE 1

In the case of input data $(b_{11}b_{10} - - -b_2b_1b_0) = (010101\ 010101)$

In this case, the most significant bit ($b_{11}$) of the input data is equal to 0 so that a conversion processing pattern in the 7/15 modulation in the present invention is provided as shown in FIG. 2.

Namely, input data $(b_{10} - - - b_6) = (10101)$ of the first group composed of 5 bits are inputted to the first conversion table TB1. On the other hand, input data $(b_5 - - - b_0) = (010101)$ of the second group composed of 6 bits are inputted to the third conversion table TB3.

The input data $(b_{10} - - - b_6) = (10101)$ of the first group inputted to the first conversion table TB1 shown in FIG. 5 are converted to the corresponding output code $(c_{14} - - - c_8) = (1010010)$ of 7 channel bits. On the other hand, the input data $(b_5 - - - b_0) = (010101)$ of the second group inputted to the third conversion table TB3 shown in FIG. 7 are converted to the corresponding output code $(c_7 - - - c_0) = (10100101)$ of 8 channel bits.

Accordingly, the output code of 15 channel bits becomes $(c_{14}c_{13} - - - c_2c_1c_0) = (1010010\ 10100101)$ by combining the above $(c_{14} - - - c_8) = (1010010)$ with the above $(c_7 - - - c_0) = (10100101)$. Thus, the input data (010101 010101) of 12 bits are 7/15-modulated to the output code (1010010 10100101) of 15 channel bits.

EXAMPLE 2

In the case of input data $(b_{11}b_{10} - - -b_2b_1b_0) = (110101\ 010101)$

In this case, the most significant bit ($b_{11}$) of the input data is equal to 1 and two specified bits ($b_5b_4$) in the second group ($b_5 - - -b_0$) are equal to 01. Accordingly, the conversion processing pattern in the 7/15 modulation in the present invention is provided as shown in FIG. 3.

Namely, input data $(b_{10} - - - b_6) = (10101)$ of the first group composed of 5 bits are inputted to the first conversion table TB1. On the other hand, the input data $(b_5 - - - b_0) = (010101)$ of the second group composed of 6 bits are inputted to the fourth conversion table TB4.

The input data $(b_{10} - - - b_6) = (10101)$ of the first group inputted to the first conversion table TB1 shown in FIG. 5 are converted to the corresponding output code $(c_{14} - - - c_8) = (1010010)$ of 7 channel bits. This converted output code is then inverted to $(c_{14} - - - c_8) = (0101101)$ by an inverter INV with respect to code, thereby outputting the inverted results. On the other hand, the input data $(b_5 - - - b_0) = (010101)$ of the second group inputted to the fourth conversion table TB4 shown in FIG. 8 are converted to the corresponding output code $(c_7 - - -c_0) = (01001100)$ composed of 8 channel bits.

Accordingly, the output code of 15 channel bits becomes $(c_{14}c_{13} - - - c_2c_1c_0) = (0101101\ 01001100)$ by combining the above $(c_7 - - - c_0) = (01001100)$ with the above $(c_{14} - - - c_8) = (0101101)$ inverted with respect to code. Thus, the input data (110101 010101) of 12 bits are 7/15-modulated to the output code (0101101 01001100) of 15 channel bits.

EXAMPLE 3

In the case of input data $(b_{11}b_{10} - - -b_2b_1b_0) = (110101\ 110101)$

In this case, the most significant bit ($b_{11}$) of the input data is equal to 1 and two specified bits ($b_5b_4$) in the second group ($b_5 - - -b_0$) are equal to 11. Accordingly, the conversion processing pattern in the 7/15 modulation in the present invention is provided as shown in FIG. 4.

Namely, zero is added to the input data $(b_{10} - - - b_6) = (10101)$ of the first group composed of 5 bits as the most significant bit thereof. The input data $(0, b_{10} - - - b_6) = (010101)$ composed of 6 bits are thus inputted to the fourth conversion table TB4. On the other hand, the input data $(b_3b_2b_1b_0) = (0101)$ of 4 bits except for the above two specified bits ($b_5b_4$) of the second group are inputted to the second conversion table TB2.

The input data $(b_{10} - - - b_6) = (10101)$ of the first group inputted to the fourth conversion table TB4 shown in FIG. 8 are converted to the corresponding output code $(c_7 - - -c_0) = (01001100)$ of 8 channel bits. This converted output code is then inverted to $(c_7 - - -c_0) = (10110011)$ by an inverter INV with respect to code, thereby outputting the inverted results. On the other hand, the input data $(b_3b_2b_1b_0) = (0101)$ of the second group inputted to the second conversion table TB2 shown in FIG. 6 are converted to the corresponding output code $(c_{14} - - - c_8) = (0010010)$ composed of 7 channel bits.

Accordingly, the output code of 15 channel bits becomes $(c_{14}c_{13} - - - c_2c_1c_0) = (0010010\ 10110011)$ by combining the above $(c_{14} - - - c_8) = (0010010)$ with the above $(c_7 - - - c_0) = (10110011)$ inverted with respect to code. Thus, the input data (110101 110101) of 12 bits are 7/15-modulated to the output code (0010010 10110011) of 15 channel bits.

In the above embodiment, the respective memory capacities of the conversion tables are provided as follows.

The first conversion table: 32 words × 7 bits
The second conversion table: 16 words × 7 bits
The third conversion table: 64 words × 8 bits
The fourth conversion table: 48 words × 8 bits Accordingly, it is sufficient to approximately use 160 words × 8 bits as a total memory capacity of the four conversion tables so that the memory capacity for the conversion tables can be reduced. When the input data having 4096 combinations correspond to the output code as one-to-one, the memory capacity becomes 4096 words × 15 bits.

As mentioned above, in the data modulating system in the present invention, 12 bits of the input data correspond to 15 channel bits of the output code to perform the 7/15 modulation. Accordingly, it is possible to increase the amount of input data bits per one channel bit such as 12/15=0.8. Therefore, it is possible to improve recording density of data in an optical disk, etc.

Further, in the data modulating systems in the present invention, the input data of 12 bits and the output code of 15 channel bits are respectively divided into two groups. The output code of a predetermined group is obtained by accessing a predetermined conversion table with each group as one unit. Therefore, in addition to the above-mentioned effects, it is possible to reduce the memory capacity for the conversion tables and the cost of the data modulating system.

Many widely different embodiments of the present invention may be constructed without departing from the spirit and scope of the present invention. It should be understood that the present invention is not limited to the specific embodiments described in the specification, except as defined in the appended claims.

What is claimed is:

1. A data modulating system comprising:
   means for receiving input data composed of 12 bits; and
   means for converting the received input data composed of 12 bits to an output code composed of 15 bits such that each of 7 channel bits in the output code composed of 15 bits is set to a code "1".

2. A data modulating system according to claim 1, in which the output code composed of 15 bits is divided into a first group composed of 7 bits and a second group composed of 8 bits, each group containing some of said 7 channel bits, and the number of channel bits in the first group and the number of channel bits in the second group are respectively 3 and 4, 4 and 3, or 2 and 5.

3. A data modulating system according to claim 2, in which the means for converting further comprises a first conversion table in which the 7 bits of the first group of the output code correspond to 5 bits of the input data and include 3 of said channel bits, a second conversion table in which the 7 bits of the first group of the output code correspond to 4 bits of the input data and include 2 of said channel bits, a third conversion table in which the 8 bits of the second group of the output code correspond to 6 bits of the input data and include 4 of said channel bits, and a fourth conversion table in which the 8 bits of the second group of the output code correspond to 6 bits of the input data and include 3 of said channel bits, in order to convert the input data to the output code.

4. A data modulating system according to claim 3, in which the means for converting comprises means for converting to the output code of the first group based on the first conversion table and for converting to the output code of the second group based on the third conversion table.

5. A data modulating system according to claim 3, in which the means for converting comprises converting to the output code of the first group by inverting an output of the first conversion table and for converting to the output code of the second group based on the fourth conversion table.

6. A data modulating system according to claim 3, in which the means for converting comprises means for converting to the output code of the first group based on the second conversion table and for converting to the output code of the second group by inverting an output of the fourth conversion table.

7. A data modulating system according to claim 4, in which the input data composed of 12 bits are divided into a first group composed of 5 bits, a second group composed of 6 bits and a remaining 1 bit and the input data of the first group are inputted to the first conversion table and the input data of the second group are inputted to the third conversion table when the remaining 1 bit is in a predetermined first bit state of two possible bit states "0" and "1".

8. A data modulating system according to claim 5, in which the input data composed of 12 bits are divided into a first group composed of 5 bits, a second group composed of 6 bits and a remaining 1 bit, the input data of the first group are inputted to the first conversion table and the input data of the second group are inputted to the fourth conversion table when the remaining 1 bit is in a second bit state of two possible bit states "0" and "1" and a set of 2 bits specified in the second group of the input data are in one state of three predetermined bit states of four possible bit states.

9. A data modulating system according to claim 6, in which the input data composed of 12 bits are divided into a first group composed of 5 bits, a second group composed of 6 bits and a remaining 1 bit, the input data of the first group are inputted to the fourth conversion table and the input data of 4 bits except for 2 specified bits in the second group are inputted to the second conversion table when the remaining 1 bit is in a second bit state of two possible bit states "0" and "1", the 2 specified bits in the second group of the input data are in a remaining one bit state except for three predetermined bit states of four possible bit states.

* * * * *